(12) United States Patent
Itoi

(10) Patent No.: US 9,172,047 B2
(45) Date of Patent: *Oct. 27, 2015

(54) HOLE TRANSPORT MATERIAL FOR ORGANIC ELECTROLUMINESCENCE DEVICE AND ORGANIC ELECTROLUMINESCENCE DEVICE USING THE SAME

(71) Applicant: SAMSUNG DISPLAY CO., LTD., Yongin-City, Gyeonggi-Do (KR)

(72) Inventor: Hiroaki Itoi, Yokohama (JP)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/155,667

(22) Filed: Jan. 15, 2014

(65) Prior Publication Data

US 2014/0155624 A1    Jun. 5, 2014

Related U.S. Application Data

(63) Continuation-in-part of application No. 14/091,421, filed on Nov. 27, 2013.

(30) Foreign Application Priority Data

Nov. 30, 2012    (JP) .................................. 2012-262808

(51) Int. Cl.
*C07D 209/82* (2006.01)
*H01L 51/00* (2006.01)

(52) U.S. Cl.
CPC ........ *H01L 51/0061* (2013.01); *H01L 51/0072* (2013.01); *H01L 51/0073* (2013.01); *H01L 51/0094* (2013.01)

(58) Field of Classification Search
USPC .................................................. 548/440, 446
See application file for complete search history.

(56) References Cited

FOREIGN PATENT DOCUMENTS

| | | |
|---|---|---|
| JP | 2009-130142 A | 6/2009 |
| JP | 2009-298767 A | 12/2009 |
| JP | 2010-070495 A | 4/2010 |
| JP | 2011-001349 A | 1/2011 |
| JP | 2011-088836 A | 5/2011 |
| JP | 2012-089777 A | 5/2012 |
| JP | 2012-097091 A | 5/2012 |
| KR | 10-2012-0020901 A | 3/2012 |
| WO | WO 2009/096202 A1 | 8/2009 |
| WO | WO 2010/044342 A1 | 4/2010 |
| WO | WO 2011/019156 A1 | 2/2011 |
| WO | WO 2011/125680 A1 | 10/2011 |
| WO | WO 2011/152596 A1 | 12/2011 |
| WO | WO 2012/077902 A2 | 6/2012 |

*Primary Examiner* — Nyeemah A Grazier
(74) *Attorney, Agent, or Firm* — Lee & Morse, P.C.

(57) ABSTRACT

A hole transport material for the organic electroluminescence device, the hole transport material being represented by the following Formula 1,

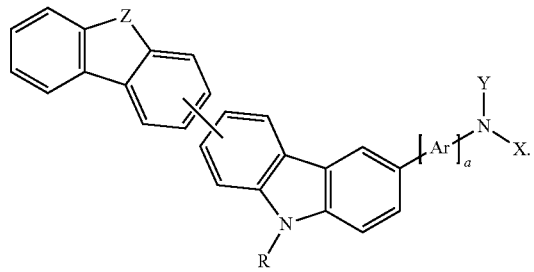

10 Claims, 1 Drawing Sheet

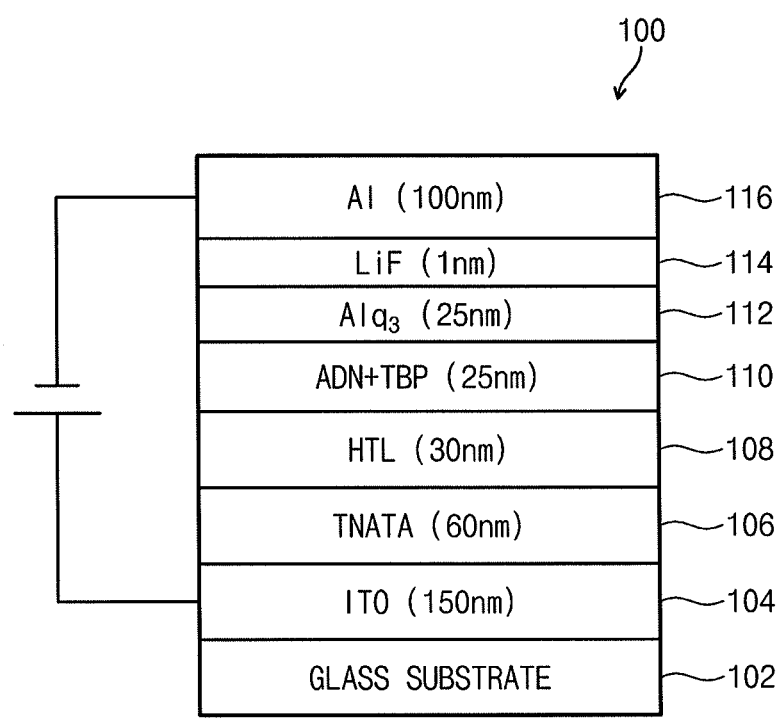

HOLE TRANSPORT MATERIAL FOR ORGANIC ELECTROLUMINESCENCE DEVICE AND ORGANIC ELECTROLUMINESCENCE DEVICE USING THE SAME

CROSS-REFERENCE TO RELATED APPLICATIONS

This is a continuation-in-part application based on pending application Ser. No. 14/091,421, filed Nov. 27, 2013, the entire contents of which is hereby incorporated by reference.

Japanese Patent Application No. 2012-262808, filed on Nov. 30, 2012, in the Japanese Patent Office, and entitled: "Hole Transport Material for Organic Electroluminescence Device and Organic Electroluminescence Device using the Same," is incorporated by reference herein in its entirety.

BACKGROUND

1. Field

Embodiments relate to a hole transport material for an organic electroluminescence device and an organic electroluminescence device using the same.

2. Description of the Related Art

In recent years, organic electroluminescence (EL) displays that are one type of image displays have been actively developed. Unlike a liquid crystal display and the like, the organic EL display is a so-called self-luminescent display, which recombines holes and electrons injected from a positive electrode and a negative electrode in an emission layer to thus emit a light from a light-emitting material including an organic compound of the emission layer, thereby performing display.

SUMMARY

Embodiments are directed to a hole transport material for an organic electroluminescence device, the hole transport material being represented by the following Formula 1,

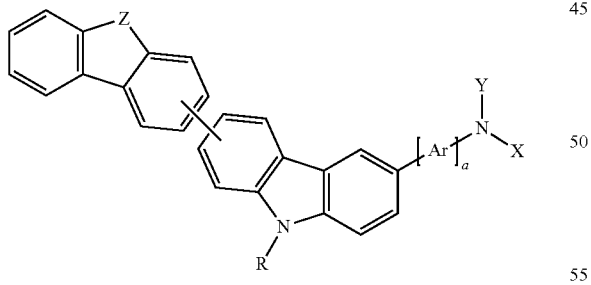

[Formula 1]

In Formula 1, X may be an aryl group or a heteroaryl group having 6 to 18 carbon atoms, Y may be an aromatic ring, a condensed ring, or a heterocycle containing nitrogen having 6 to 18 carbon atoms, Z may be O or S, Ar may be an aryl group or a heteroaryl group having 6 to 18 carbon atoms, R may be an aryl group or a heteroaryl group having 6 to 10 carbon atoms, or an alkyl group having 1 to 12 carbon atoms, and a may be an integer of 0 to 3.

Embodiments are also directed to a hole transport material for an organic electroluminescence device, the hole transport material being represented by the following Formula 1,

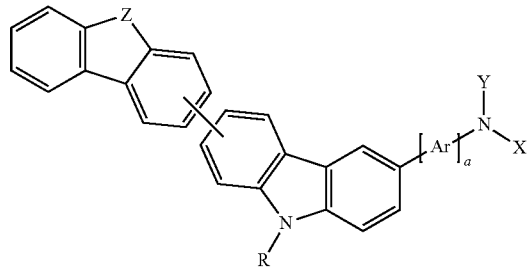

[Formula 1]

In Formula 1, Y may be an aromatic ring, a condensed ring, or a heterocycle containing nitrogen having 6 to 18 carbon atoms, Z may be O or S, Ar may be an aryl group or a heteroaryl group having 6 to 18 carbon atoms, R may be an aryl group or a heteroaryl group having 6 to 10 carbon atoms, or an alkyl group having 1 to 12 carbon atoms, a may be an integer of 0 to 3, and X may be selected from monovalent groups represented by (2) to (15) (* represents a bonding site) of following Formula 2,

[Formula 2]

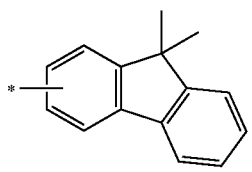

(2)

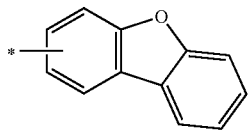

(3)

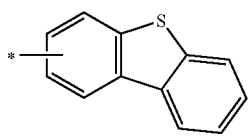

(4)

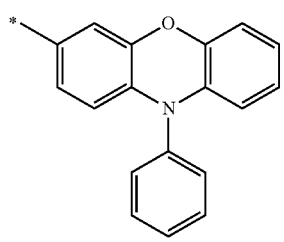

(5)

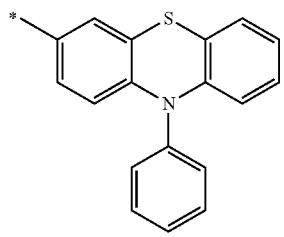

(6)

-continued (7) 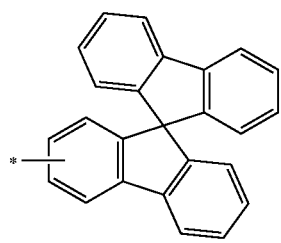

(8) 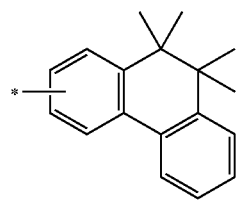

(9) 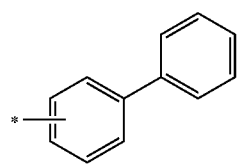

(10) 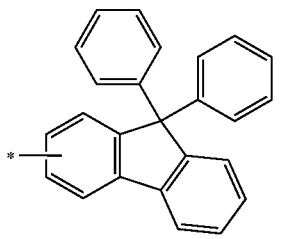

(11) 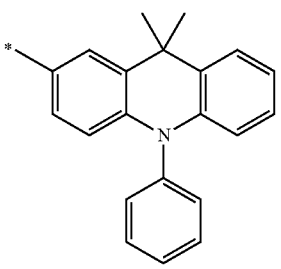

(12) 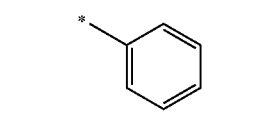

(13) 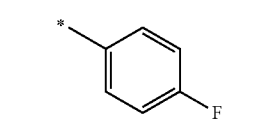

(14) 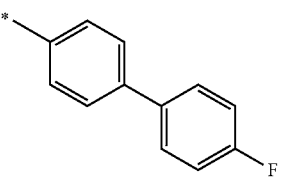

-continued

(15) 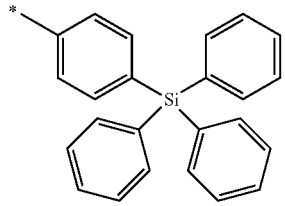

Embodiments are also directed to an organic electroluminescence device including a hole transport layer that includes a hole transport material according to an embodiment.

BRIEF DESCRIPTION OF THE DRAWING

Features will become apparent to those of skill in the art by describing in detail exemplary embodiments with reference to the attached drawings in which:

FIG. 1 is a schematic diagram illustrating an organic EL device according to an example embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. Like reference numerals refer to like elements throughout.

According to an example embodiment, an organic EL device includes an amine derivative including a carbazole group substituted with a heterofluorenyl group as a hole transport material.

An example embodiment is directed to a hole transport material for an organic EL device. An organic EL device according to an example embodiment will be described in detail with reference to the accompanying drawing.

A hole transport material for an organic EL device according to an example embodiment may be represented by the following Formula 5. The hole transport material for the organic EL device represented by Formula 5 is an amine derivative including a carbazole group substituted with a heterofluorenyl group.

[Formula 5]

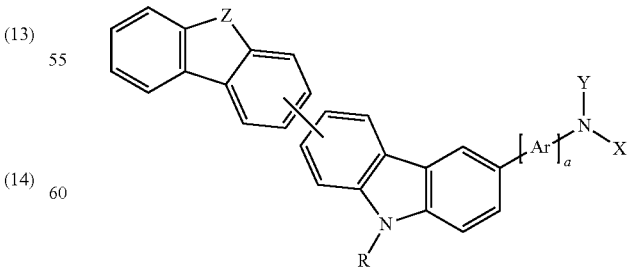

In the hole transport material for the organic EL device of Formula 5 according to the present example embodiment, X is an aryl group or a heteroaryl group having 6 to 18 carbon atoms, Y is an aromatic ring, a condensed ring, or a heterocycle containing nitrogen having 6 to 18 carbon atoms. Z is O or S. Ar is an aryl group or a heteroaryl group having 6 to 18 carbon atoms. R is an aryl group, or a heteroaryl group having 6 to 10 carbon atoms or an alkyl group having 1 to 12 carbon atoms. According to the present example embodiment, a is an integer of 0 to 3.

In the hole transport material for the organic EL device of Formula 5 according to the present example embodiment, Y, Z, Ar, R, and a may be as described above, and X may be selected from monovalent groups represented by compounds (32) to (45) (* means a bonding site) in the following Formula 6.

[Formula 6]

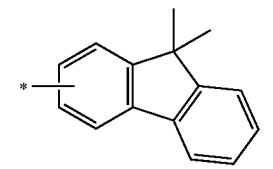
(32)

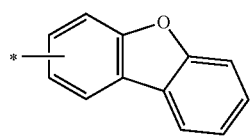
(33)

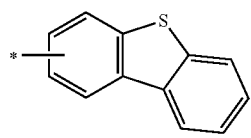
(34)

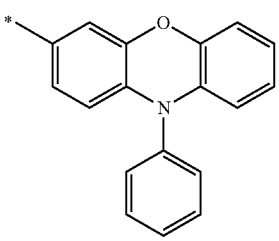
(35)

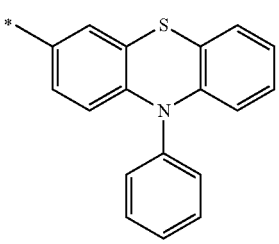
(36)

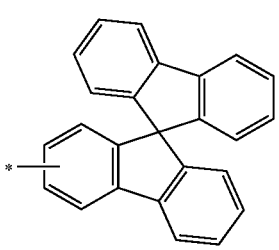
(37)

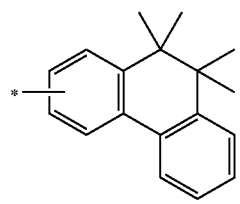
(38)

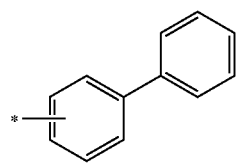
(39)

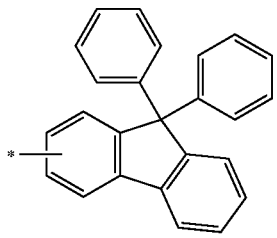
(40)

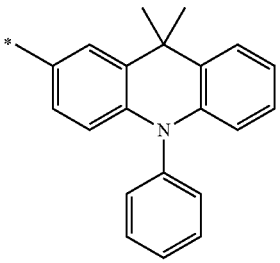
(41)

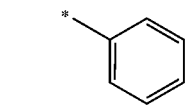
(42)

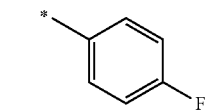
(43)

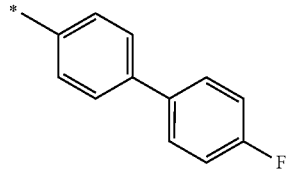
(44)

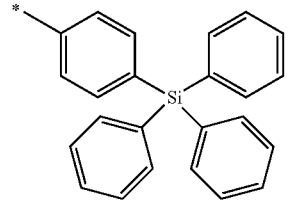
(45)

The hole transport material for the organic EL device according to an example embodiment is substituted with a tertiary amine and includes a fluorenyl group, which is an electron accepting substituent. Thus, electron durability may be improved. In addition, by introducing a phenylene group between the tertiary amine and the carbazole group, an energy gap between a highest occupied molecular orbital (HOMO) and a lowest unoccupied molecular orbital (LUMO) may be increased.

According to example embodiments, the substituted position of the carbazolyl group and the heterofluorenyl group in the hole transport material of the organic EL device may be changed. Thus, layer properties and electron distribution may be changed, and hole transporting properties may be improved. For example, in Formula 5, the heterofluorenyl group may be combined to the 3 position or 6 position, and an electron rich group may be protected. In another example, the heterofluorenyl group may be combined to the 4 position.

The hole transport material for the organic EL device according to an example embodiment may be, for example, materials represented by the following Formula 7.

[Formula 7]

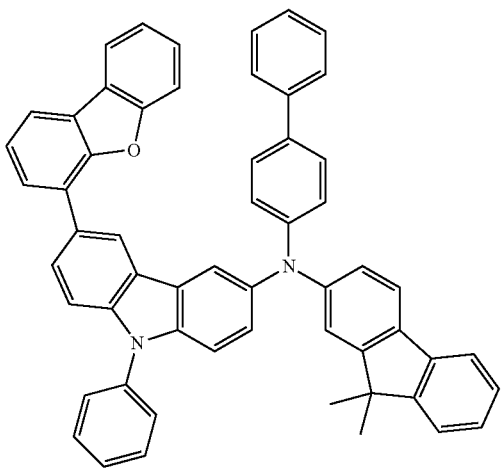

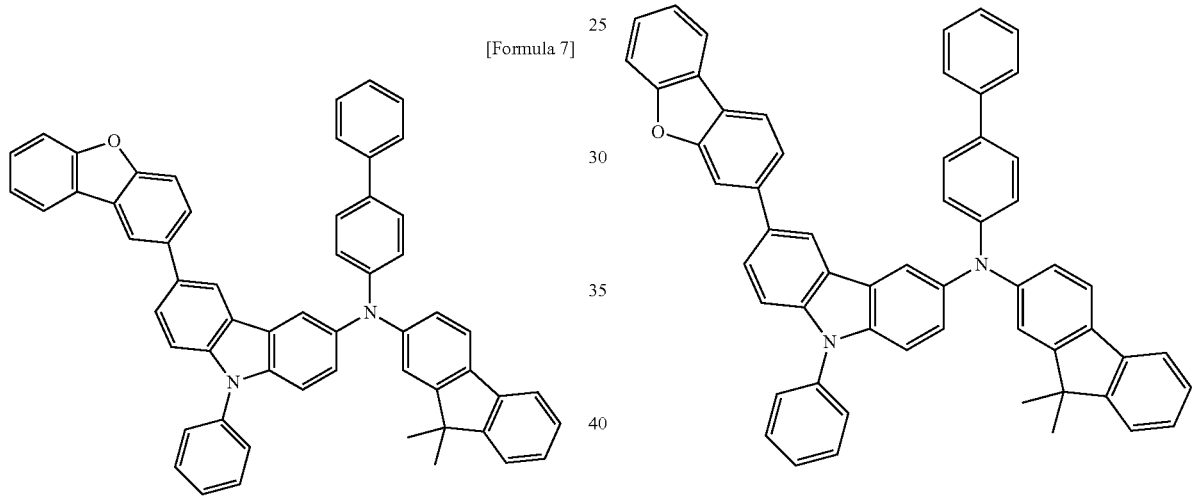

The hole transport material for the organic EL device according to an example embodiment may be, for example, materials represented by the following Formula 8.

[Formula 8]

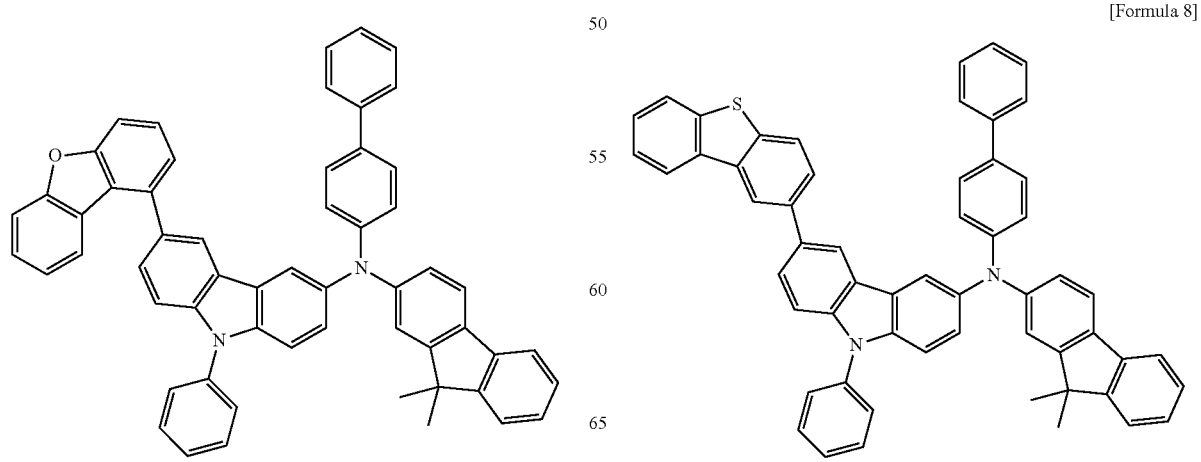

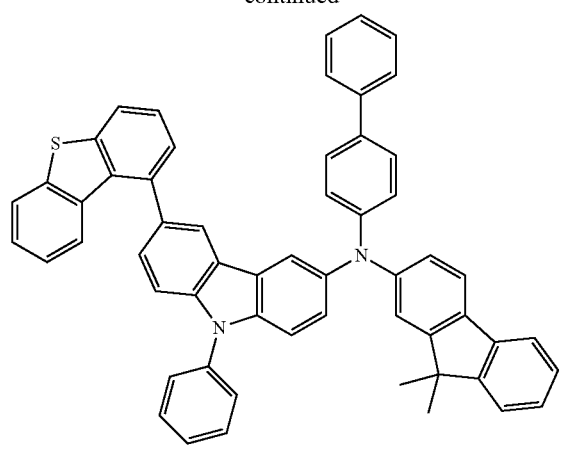
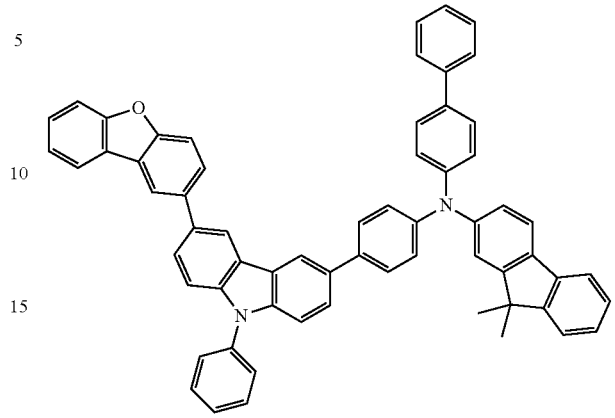
[Formula 9]
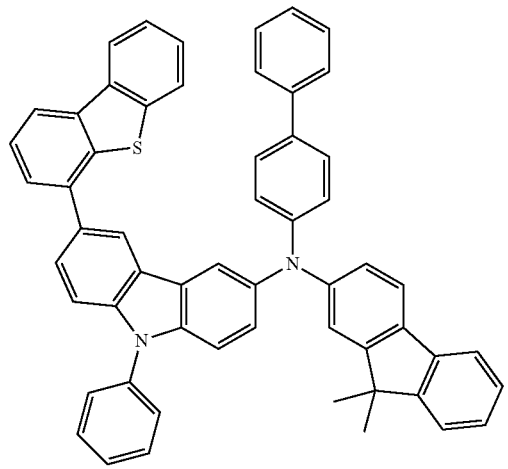
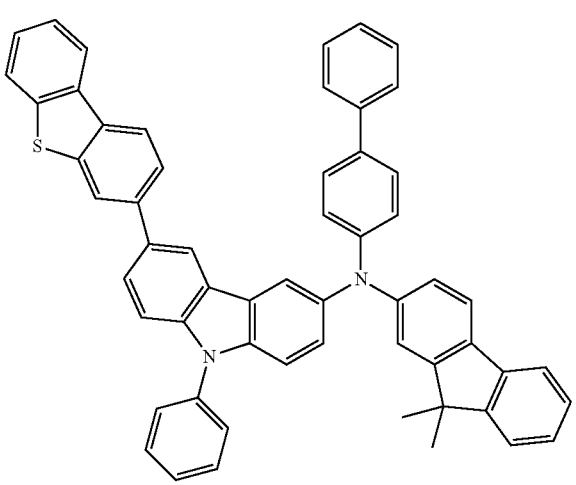
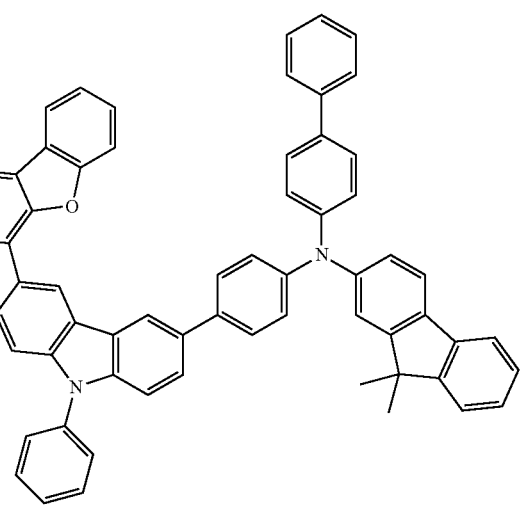
The hole transport material for the organic EL device according to an example embodiment may be, for example, materials represented by the following Formula 9.

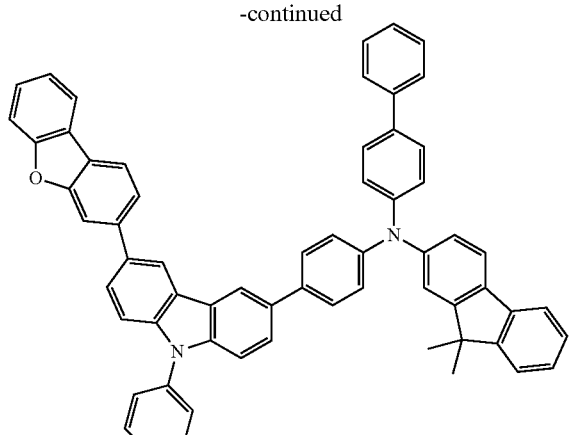
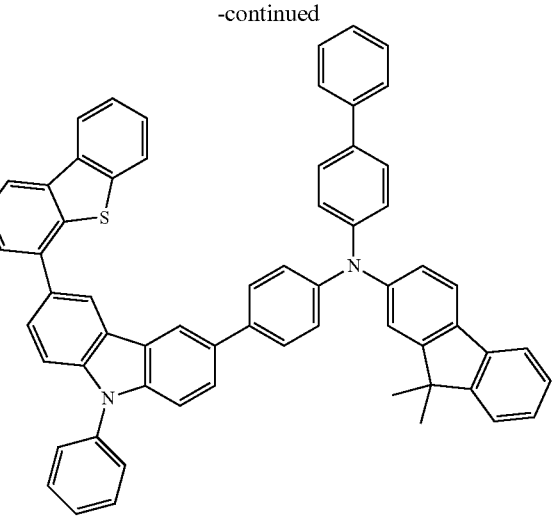
The hole transport material for the organic EL device according to an example embodiment may be, for example, materials represented by the following Formula 10.
[Formula 10]
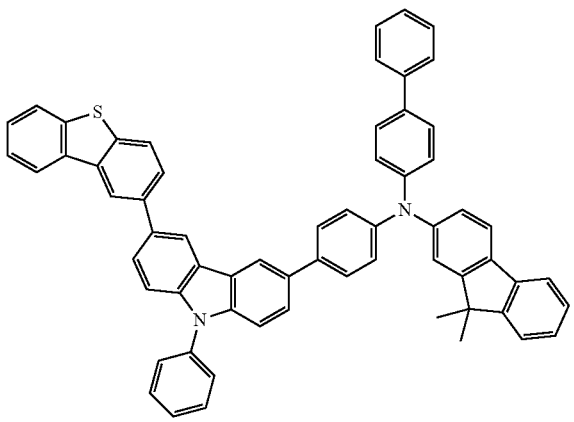 [SMILES: c1ccc(-c2ccc(N(c3ccc(-c4ccc5c(c4)c4cc(-c6ccc7sc8ccccc8c7c6)ccc4n5-c4ccccc4)cc3)c3ccc4c(c3)oc3ccccc34)cc2)cc1]
The hole transport material for the organic EL device according to an example embodiment may be, for example, materials represented by the following Formula 11.
[Formula 11]
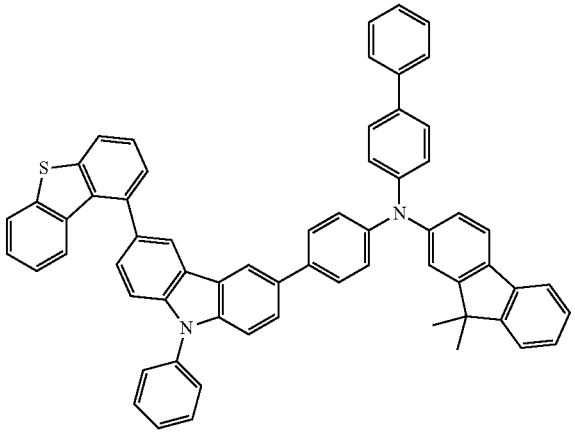
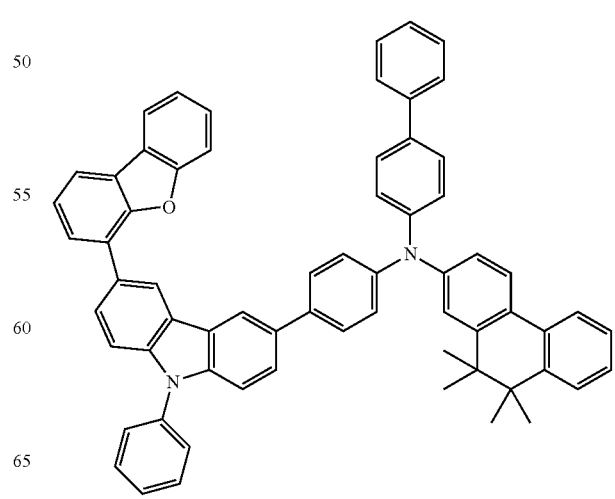

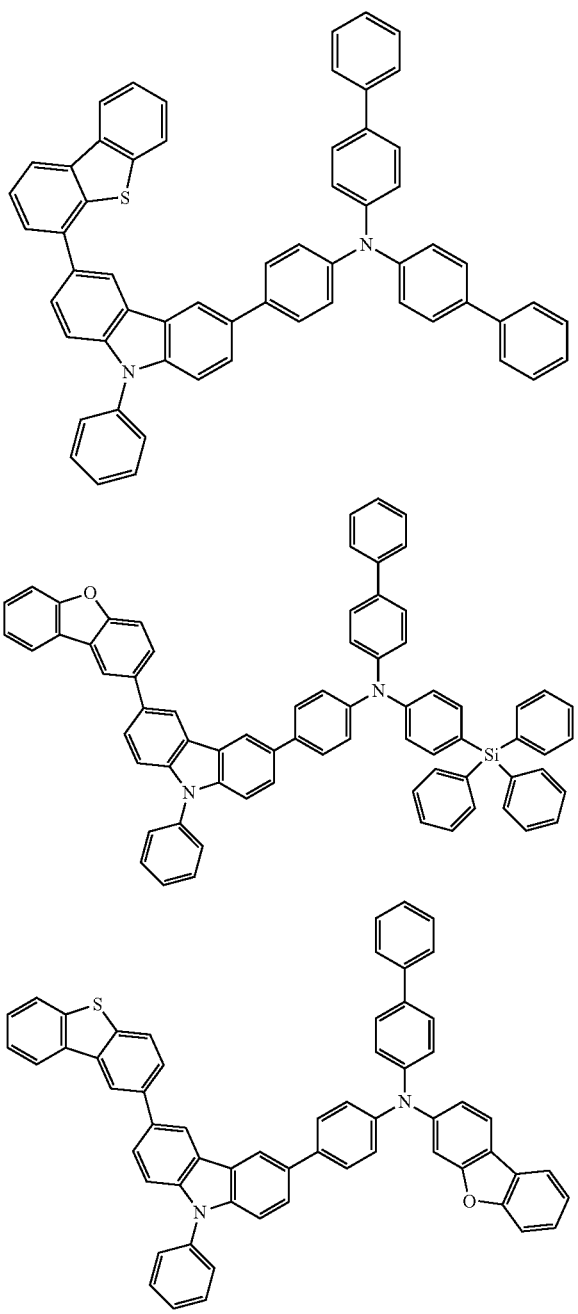

A hole transport layer of an organic EL device according to an example embodiment may be formed to include one or more of the above-described chemical formulae. The hole transport layer may provide high efficiency and long life in the organic EL device. The hole transport material for the organic EL device according to an example embodiment may help realize a low voltage driving of an organic EL device in a blue color region. A hole transport layer including the carbazole group may have strong durability with respect to electrons and, in the hole transport material for the organic EL device according to an example embodiment, the heterofluorene group may be introduced in an amine compound containing the carbazole group exhibiting hole transport properties. Thus, the hole transport properties may be improved, and a high glass transition temperature (Tg) may be obtained. In addition, the lowering of the voltage of a device in a blue color region may be realized.

Organic EL Device

An organic EL device using the hole transport material for the organic EL device according to an example embodiment will now be described.

FIG. 1 is a schematic diagram illustrating an organic EL device 100 according to an example embodiment.

According to the present example embodiment, the organic EL device 100 includes, for example, a substrate 102, a positive electrode 104, a hole injection layer 106, a hole transport layer 108, an emission layer 110, an electron transport layer 112, an electron injection layer 114, and a negative electrode 116.

The substrate 102 may be, for example, a transparent glass substrate, a flexible substrate of a semiconductor substrate resin including silicon, and the like. The positive electrode 104 may be on the substrate 102, and may be formed by using indium tin oxide (ITO), indium zinc oxide (IZO), and the like. The hole injection layer 106 may be on the positive electrode 104, and may include 4,4',4''-tris(N-1-naphthyl-N-phenylamino)triphenylamine (1-TNATA), and the like. The hole transport layer 108 may be on the hole injection layer 106 and may be formed by using the hole transport material for an organic EL device according to an example embodiment. The emission layer 110 may be on the hole transport layer 108 and may be formed by, for example, doping Tetra-t-butyl perylene (TBP) into a host material including 9,10-di(2-naphthyl)anthracene (ADN). The electron transport layer 112 may be on the emission layer 110 and may be formed by using a material including, for example, tris(8-hydroxyquinolinato)aluminum (Alq$_3$). The electron injection layer 114 may be on the electron transport layer 112 and may be formed by using a material including, for example, lithium fluoride (LiF). The negative electrode 116 is formed on the electron injection layer 114, and may be formed by using a metal such as Al or a transparent material such as ITO, IZO, and the like.

In the organic EL device 100 according to the present example embodiment, a hole transport layer having high efficiency and long life may be formed by using the hole transport material for an organic EL device according to an example embodiment. The hole transport material for the organic EL device according to an example embodiment may also be applied in an organic EL apparatus of an active matrix using a TFT.

EXAMPLES

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthetic Method

The above-described hole transport material for an organic EL device according to an example embodiment may be synthesized by, for example, the following Formula 12.

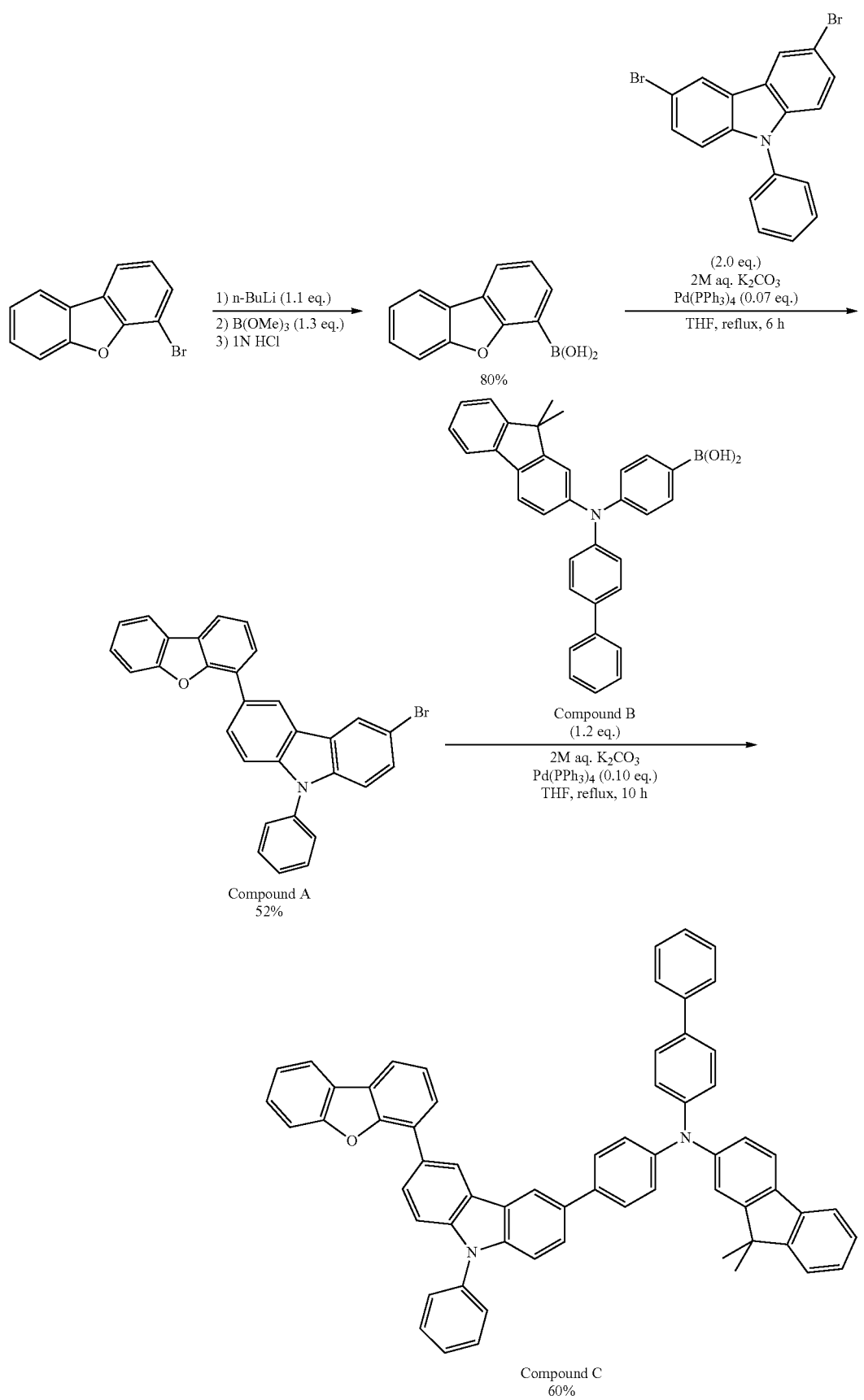

Synthesis of dibenzofuran-4-boronic acid

In a 300 ml three-necked flask, 7.2 g of 4-bromodibenzofuran was dissolved in −78° C. anhydrous tetrahydrofuran (THF) under an argon atmosphere. Then, 20 ml of an n-butyl lithium-n-hexane solution (1.6 M, 1.1 eq) was added and stirred for 1 hour. 4.23 ml (1.3 eq) of trimethoxyborane (B(OMe)$_3$) was added and stirred for 2 hours, and the temperature of the reaction system was increased to room temperature. 200 ml of 1 N hydrochloric acid was added into the reactant and stirred for 3 hours. An organic layer was separated, and solvents were distilled off. In the crude product thus obtained, hexane was added. Precipitated product was filtered to obtain 4.94 g of dibenzofuran-4-boronic acid as a white solid (yield 80%). The product was measured by FAB-MS, and dibenzofuran-4-boronic acid having a molecular weight of 212 was detected.

Synthesis of Compound A

Into a 200 ml three-necked flask, 1.92 g of dibenzofuran-4-boronic acid, 10.0 g (2 eq) of 3,6-dibromo-9-phenylcarbazole, 20 ml of a 2 M aqueous potassium carbonate solution, and 0.73 g (0.07 eq) of phosphine tetrakistriphenylphosphinepalladium (Pd(PPh$_3$)$_4$) were added under an argon atmosphere. In 80 ml of THF, the reactant was heated and refluxed while stirring for 6 hours. After cooling in the atmosphere, an organic layer was separated and purified by using silica gel chromatography (a mixture solvent of chloroform and hexane). The crude product thus obtained was recrystallized using a mixture solvent of toluene and hexane to obtain 2.30 g of Compound A as a white solid (yield 52%).

The compound was measured and identified by $^1$H-NMR and FAB-MS. $^1$H-NMR(CDCl$_3$): 8.60 (d, 1H), 8.34 (d, 1H), 7.93-8.02 (m, 3H), 7.44-7.70 (m, 11H), 7.29-7.40 (m, 2H)

FAM-MS: 488

Synthesis of Compound C

Into a 100 ml three-necked flask, 1.10 g of Compound A, 1.30 g (1.2 eq) of Compound B, 10 ml of a 2 M aqueous potassium carbonate solution, and tetrakistriphenylphosphinepalladium (Pd(PPh$_3$)$_4$, 0.10 eq) were added under an argon atmosphere. In 40 ml of THF, the reactant was heated and refluxed while stirring for 10 hours. After cooling in the atmosphere, an organic layer was separated and purified by using silica gel chromatography (a mixture solvent of chloroform and hexane). The crude product thus obtained was recrystallized using a mixture solvent of toluene and hexane to obtain 1.14 g of Compound C as a white solid (yield 60%).

The compound was detected and identified by $^1$H-NMR and FAB-MS. $^1$H-NMR(CDCl$_3$): 8.91 (d, 1H), 8.75 (d, 1H), 8.32 (q, 1H), 8.26 (q, 1H), 8.05 (q, 1H), 7.75-7.85 (m, 11H), 7.51-7.68 (m, 10H), 7.41-7.48 (m, 3H), 7.22-7.36 (m, 8H), 7.16 (q, 1H), 1.40 (s, 6H)

FAM-MS: 844

Through performing the above-described preparation methods, three compounds illustrated in the following Formula 13 were produced.

[Formula 13]

Example 1

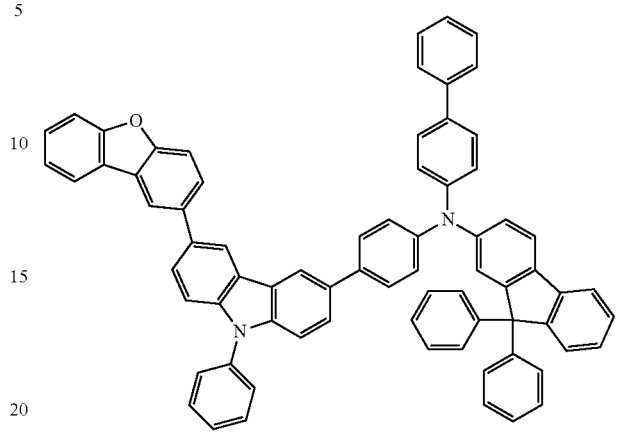

Example 2

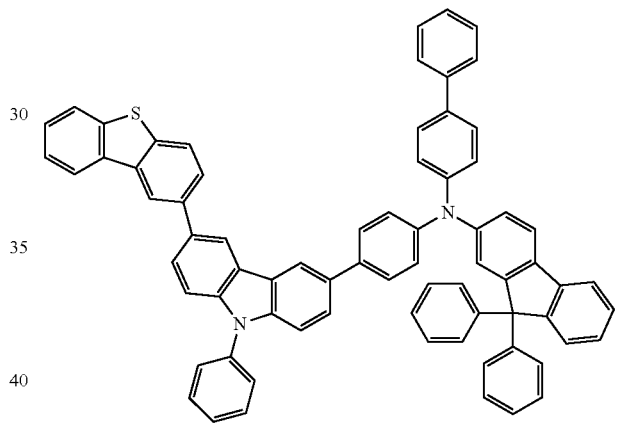

Example 3

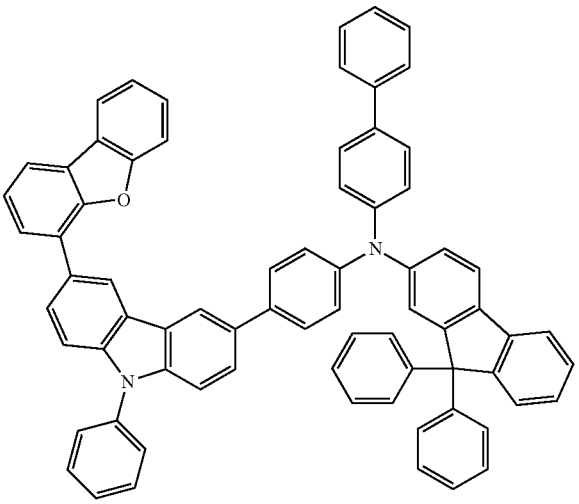

As comparative examples, two compounds illustrated in the following Formula 14 were prepared.

[Formula 14]

Comparative Example 1

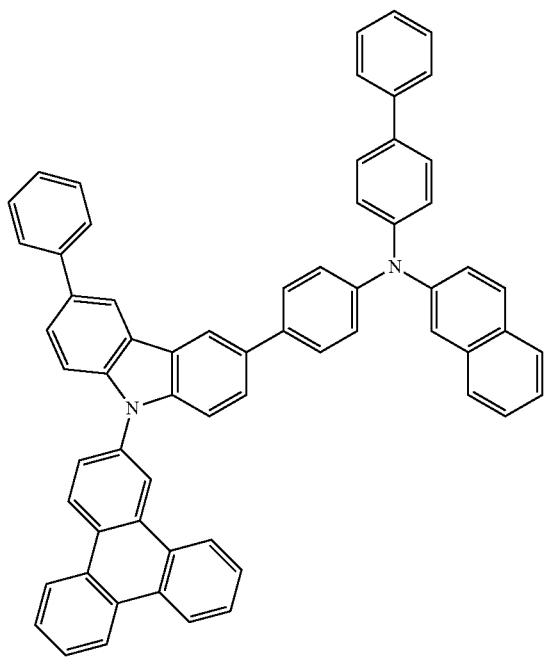

Comparative Example 2

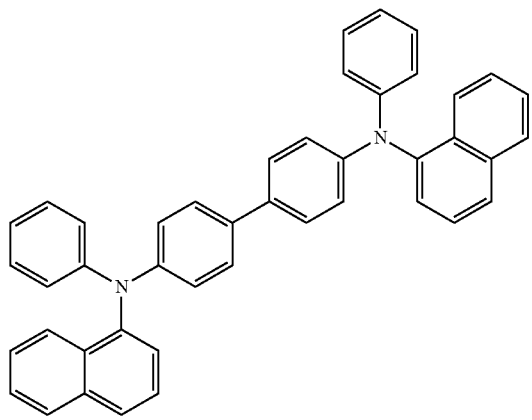

Using the compounds of Examples 1 to 3 and Comparative Examples 1 and 2 as hole transport materials, organic EL devices were manufactured. A substrate was formed by using a transparent glass substrate, a positive electrode was formed by using ITO in a thickness of about 150 nm, and a hole injection layer was formed by using 1-TNATA in a thickness of about 60 nm. A hole transport layer was formed to a thickness of about 30 nm, an emission layer obtained by doping TBP by 3% into ADN was formed to a thickness of about 25 nm, an electron transport layer was formed by using $Alq_3$ in a thickness of about 25 nm, an electron injection layer was formed by using LiF in a thickness of about 1 nm, and a negative electrode was formed by using Al in a thickness of about 100 nm.

With respect to the manufactured organic EL devices, a driving voltage, current efficiency, and half-life were evaluated. The current efficiency was measured at about 10 $mA/cm^2$, and the half-life was half-life of luminance from an initial luminance of about 1,000 $cd/m^2$. The evaluation results are illustrated in the following Table 1.

TABLE 1

| | Driving voltage (V) | Current efficiency (cd/A) | Half-life (hr) |
|---|---|---|---|
| Example 1 | 7.3 | 6.5 | 2,100 |
| Example 2 | 6.7 | 6.8 | 2,200 |
| Example 3 | 6.5 | 7.1 | 2,700 |
| Comparative Example 1 | 7.8 | 6.5 | 1,500 |
| Comparative Example 2 | 8.1 | 6.3 | 1,200 |

As shown in Table 1, the organic EL devices including the compounds of Examples 1 to 3 were driven by a lower voltage than the organic EL devices including the compounds of Comparative Examples 1 and 2. The current efficiency for the compounds of Examples 1 to 3 was the same as or better than that of the compound of Comparative Example 1 and was significantly higher than that of the compound of Comparative Example 2. With respect to the half-life, the compounds of Examples 1 to 3 exhibited the same as or better half-life when compared to the compound of Comparative Example 1, and exhibited a significantly longer half-life when compared to the compound of Comparative Example 2. As illustrated in the Examples, when the compound of Example 3 is used as the hole transport material, an organic EL device may be driven by a low voltage, and may have high efficiency and long life.

By way of summation and review, an example of a light-emitting device (an organic EL device) is an organic EL device that may include a positive electrode, a hole transport layer on the positive electrode, an emission layer on the hole transport layer, an electron transport layer on the emission layer, and a negative electrode on the electron transport layer. Holes injected from the positive electrode may be injected into the emission layer via the hole transport layer. Electrons injected from the negative electrode may then be injected into the emission layer via the electron transport layer. The holes and the electrons injected into the emission layer are recombined to generate excitons within the emission layer. The organic EL device emits a light by using a light generated by radiation and deactivation of the excitons. The described organic EL device is an example and may be changed in various forms.

In application of the organic EL device to a display apparatus, high efficiency and long life of the organic EL device are desirable. For realizing high efficiency and long life, consideration may be given to normalization, stabilization and durability of the hole transport layer.

As described above, embodiments may provide a hole transport material for an organic electroluminescence device having high efficiency and long life, and an organic electroluminescence device using the same. The hole transport material for an organic EL device according to an example embodiment may form a hole transport layer having high efficiency and long life in an organic EL device. The hole transport material for an organic EL device according to an example embodiment may be substituted with a tertiary amine and may include a fluorenyl group, which is an electron accepting substituent, and electron durability may be improved, and a hole transport layer having high efficiency and long life may be formed in an organic EL device. In a hole transport material for the organic EL device according to an example embodiment, electron durability may be improved by including the carbazolyl group and the heterofluorenyl group, and by combining the heterofluorenyl group at, e.g., the 3 position 3 and 6 position of the carbazolyl group. In addition, the crystallization of the material may be restrained by the size of a substituent group, and the lowering of the voltage of a device may be realized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A hole transport material for an organic electroluminescence device, the hole transport material being represented by the following Formula 1:

[Formula 1]

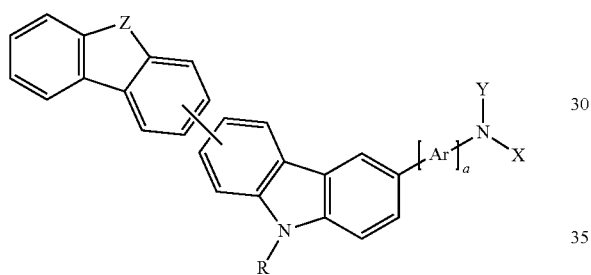

wherein, in Formula 1, X is an aryl group or a heteroaryl group having 6 to 18 carbon atoms, Y is an aromatic ring, a condensed ring, or a heterocycle containing nitrogen having 6 to 18 carbon atoms, Z is O or S, Ar is an aryl group or a heteroaryl group having 6 to 18 carbon atoms, R is an aryl group or a heteroaryl group having 6 to 10 carbon atoms, or an alkyl group having 1 to 12 carbon atoms, and a is an integer of 0 to 3.

2. An organic electroluminescence device comprising a hole transport layer that includes the hole transport material as claimed in claim 1.

3. A hole transport material for an organic electroluminescence device, the hole transport material being represented by the following Formula 1:

[Formula 1]

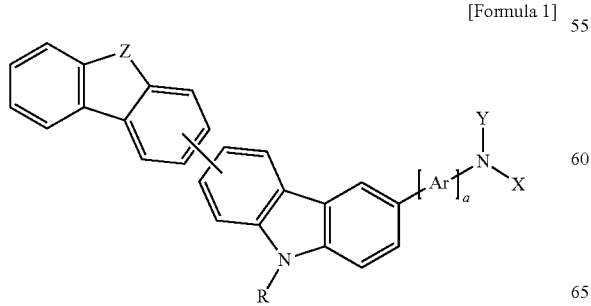

wherein, in Formula 1, Y is an aromatic ring, a condensed ring, or a heterocycle containing nitrogen having 6 to 18 carbon atoms, Z is O or S, Ar is an aryl group or a heteroaryl group having 6 to 18 carbon atoms, R is an aryl group or a heteroaryl group having 6 to 10 carbon atoms, or an alkyl group having 1 to 12 carbon atoms, a is an integer of 0 to 3, and X is one of the following Groups (2) to (15), in which * represents a bonding site, (2)

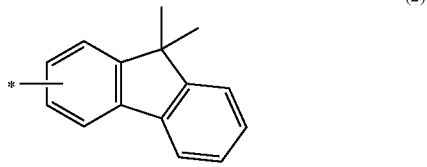

(3)

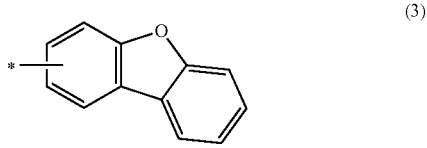

(4)

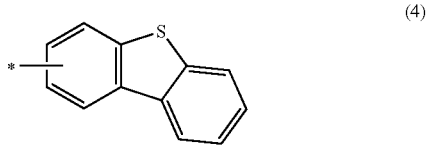

(5)

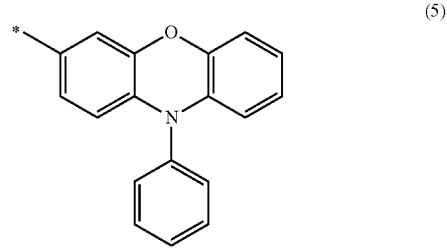

(6)

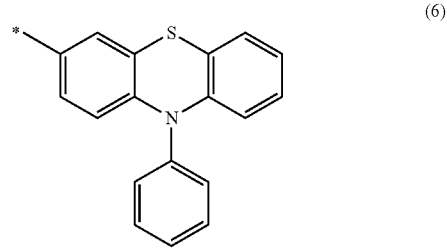

(7)

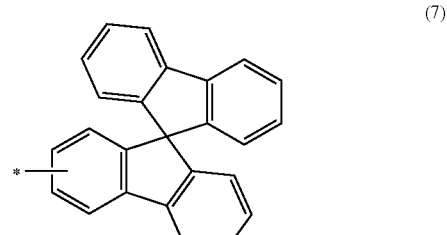

(8)

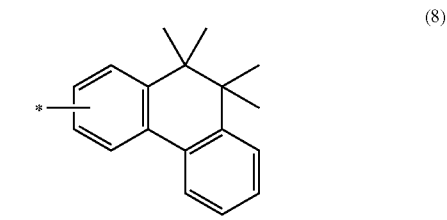

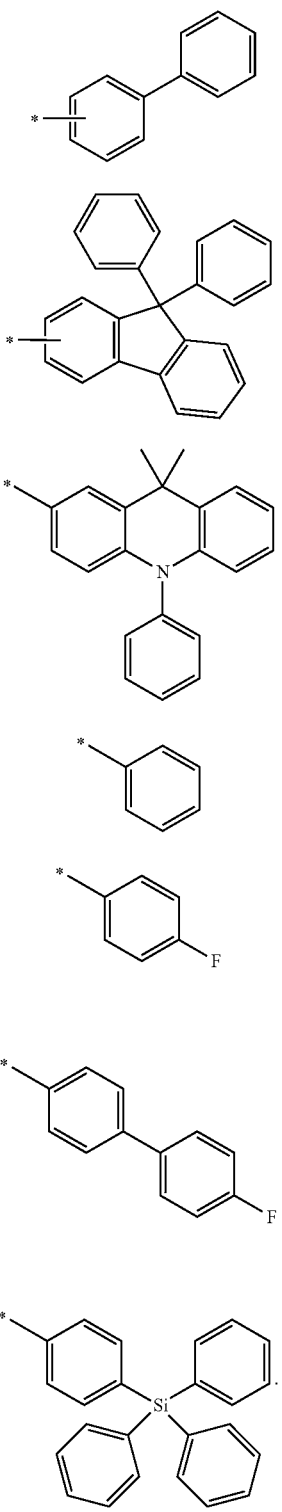

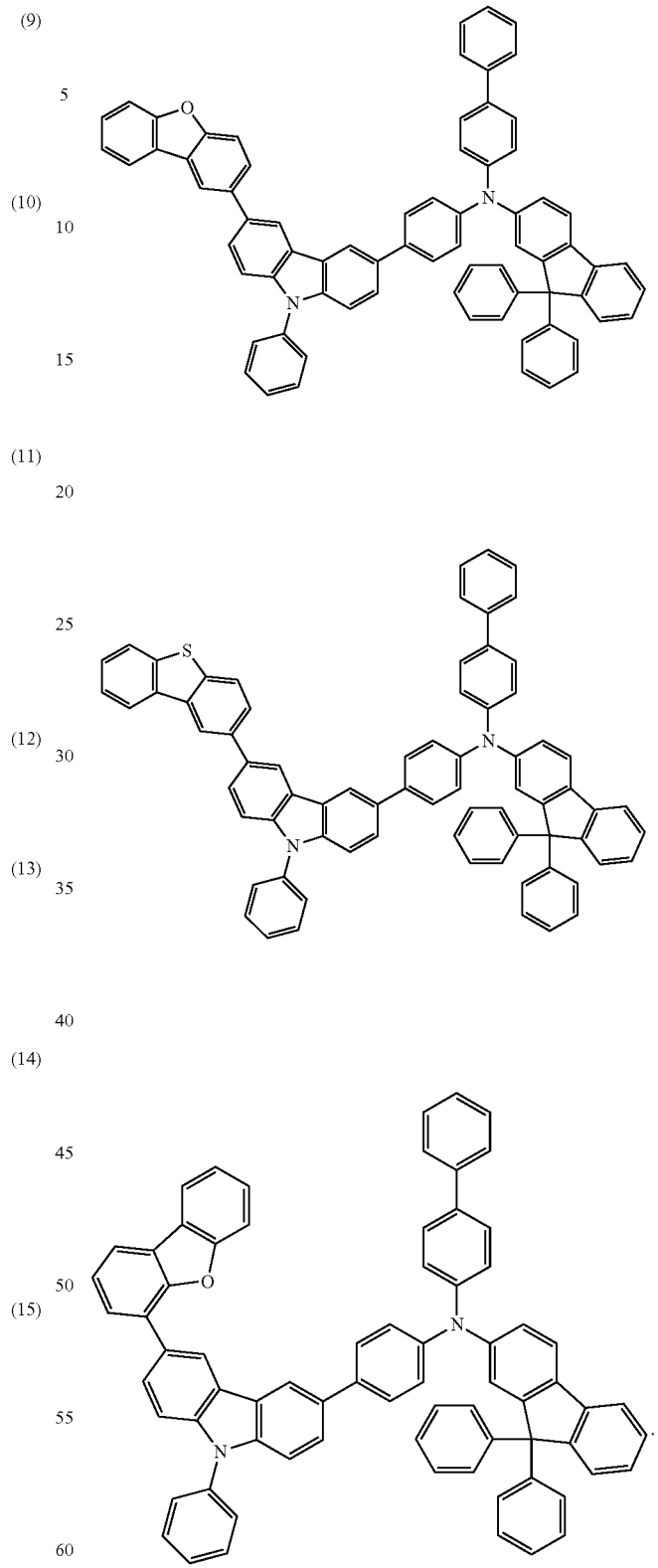

4. An organic electroluminescence device comprising a hole transport layer that includes the hole transport material as claimed in claim 3.

5. An organic electroluminescence device as claimed in claim 3, wherein the hole transport material represented by Formula 1 is one of the following compounds:

6. An organic electroluminescence device as claimed in claim 3, wherein the hole transport material represented by Formula 1 is one of the following compounds:

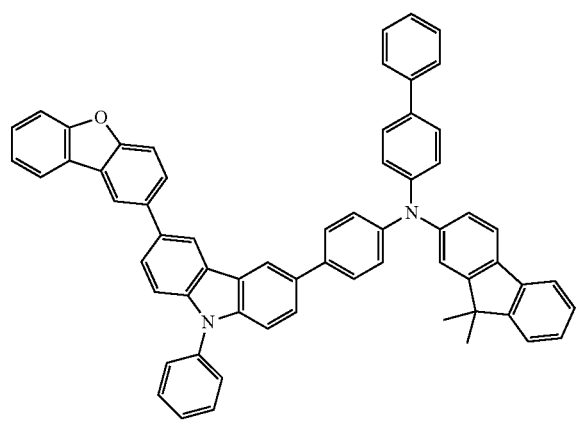
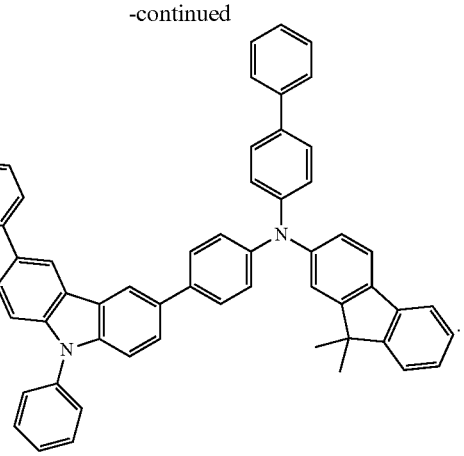
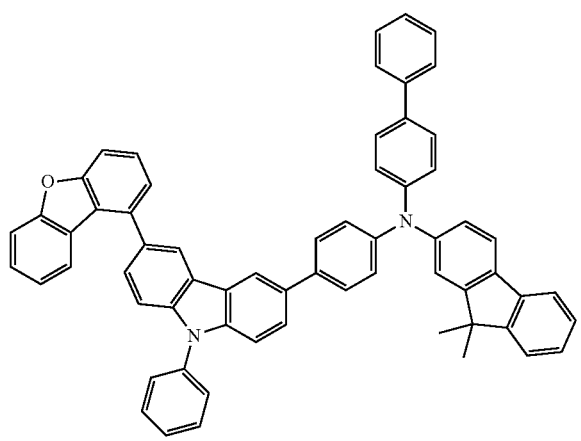
7. An organic electroluminescence device as claimed in claim 3, wherein the hole transport material represented by Formula 1 is one of the following compounds:
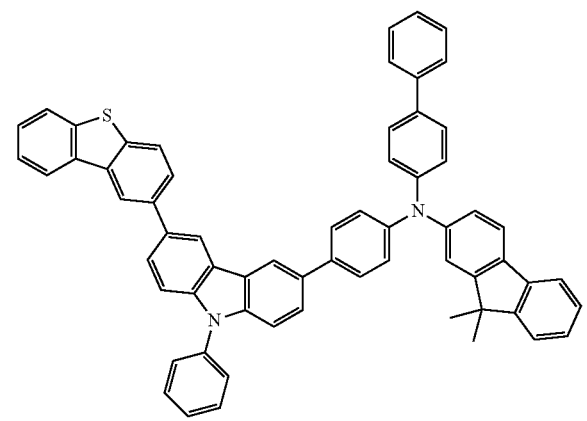
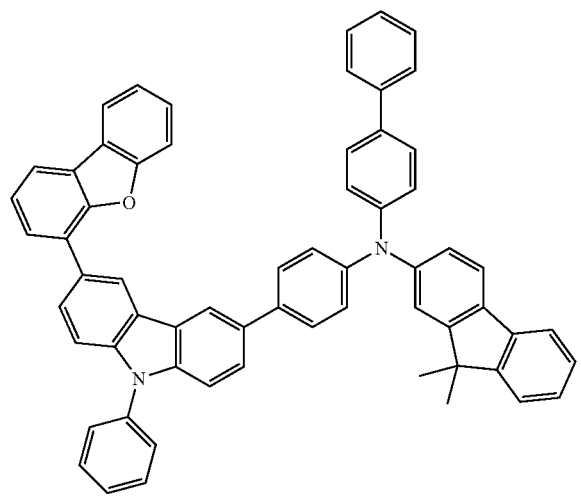
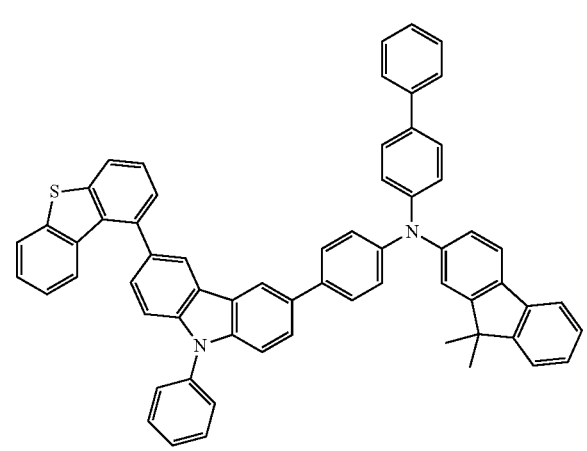

27
-continued
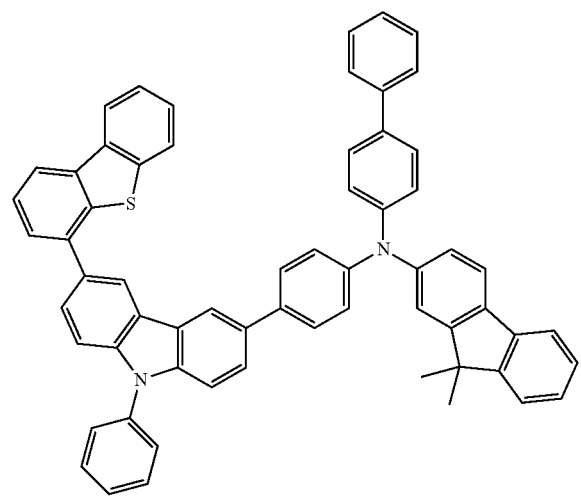
28
-continued
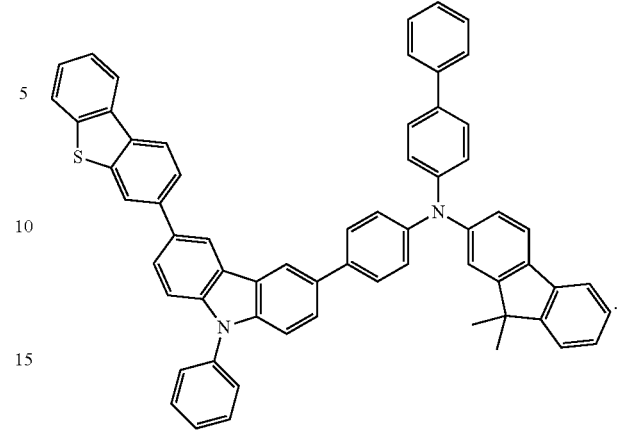
8. An organic electroluminescence device as claimed in claim 3, wherein the hole transport material represented by Formula 1 is one of the following compounds:
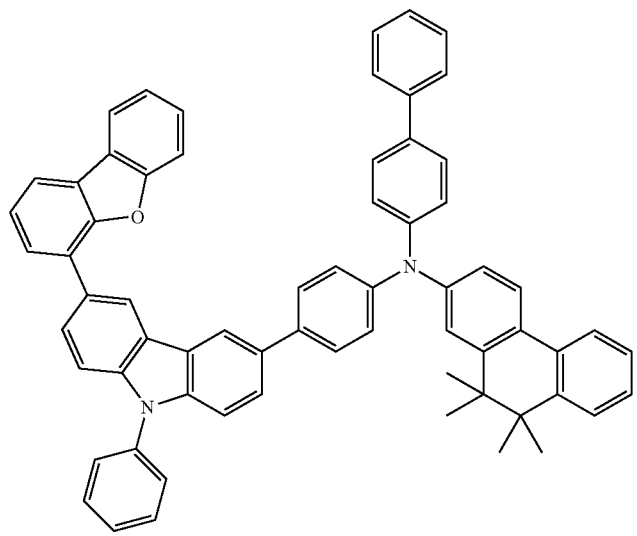
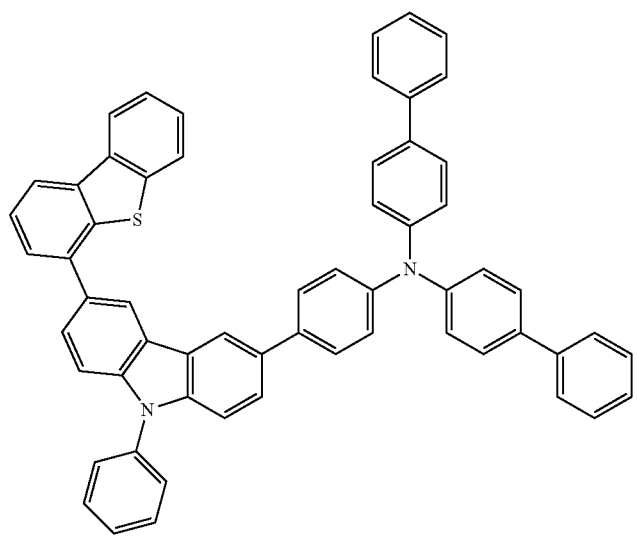

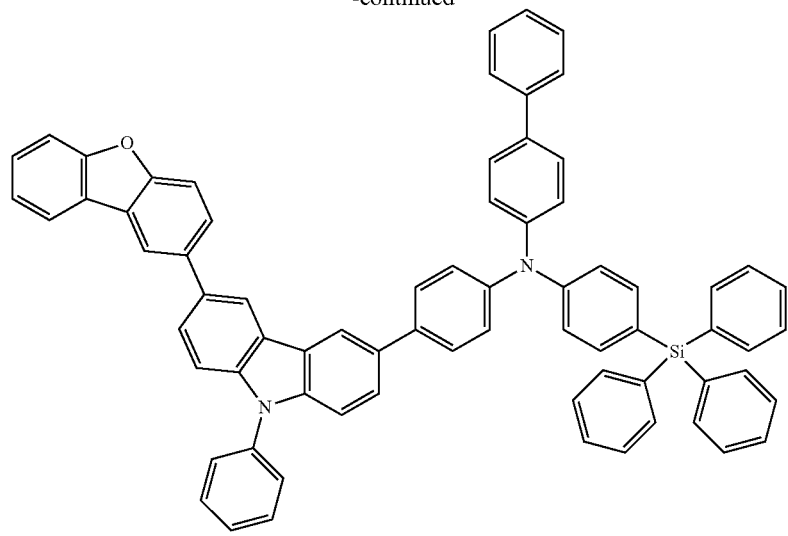
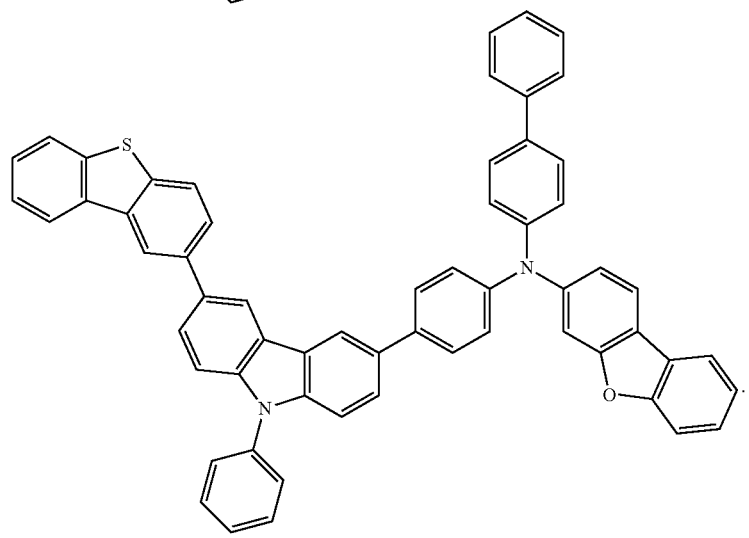
9. An organic electroluminescence device as claimed in claim 3, wherein the hole transport material represented by Formula 1 is one of the following compounds:
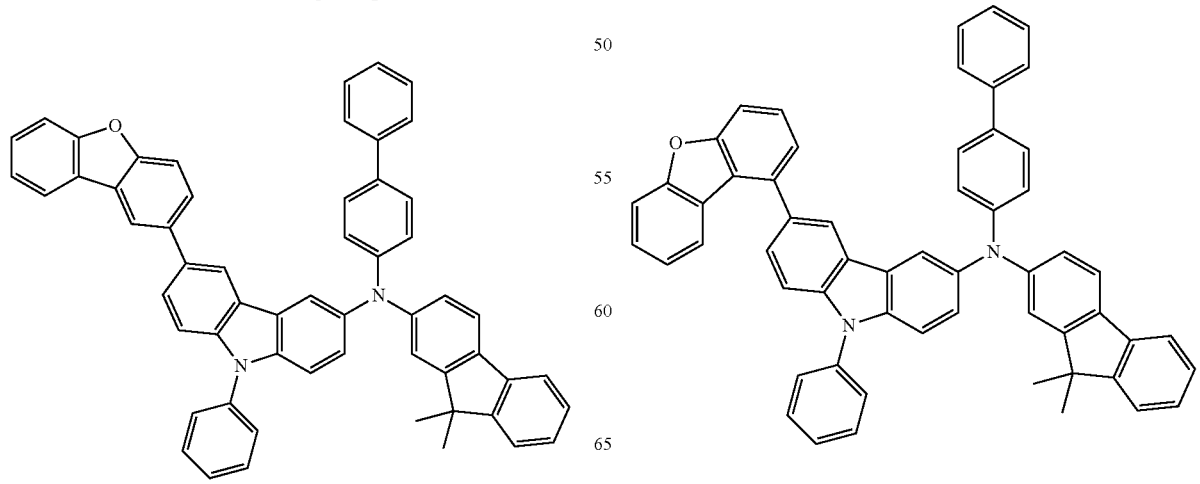

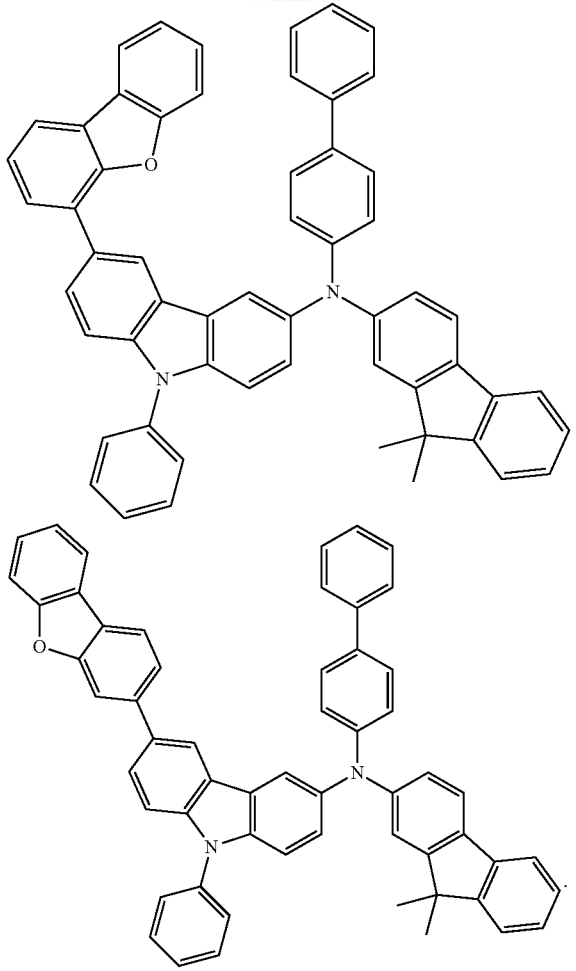
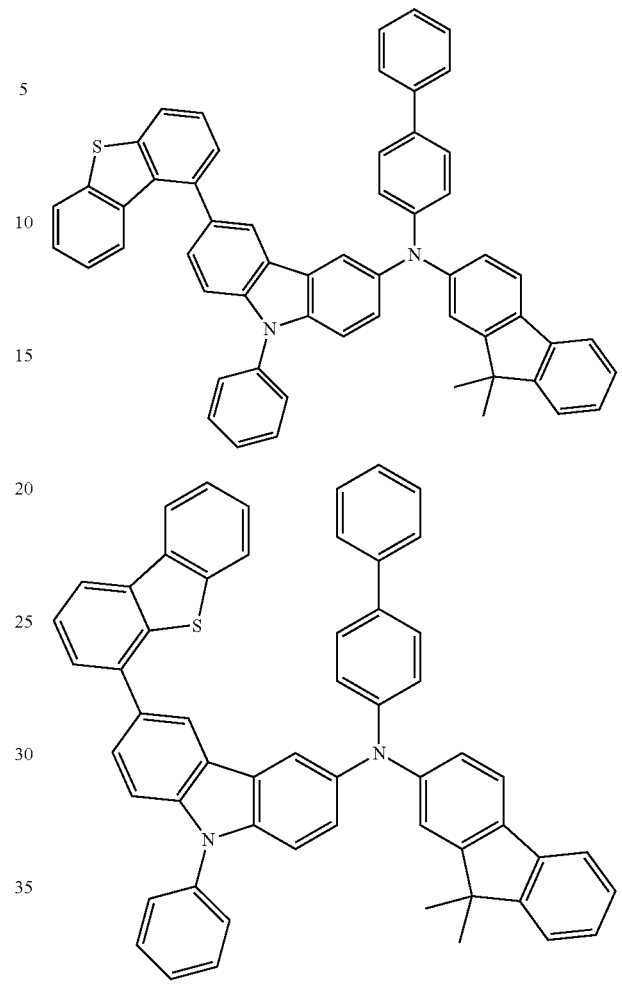
10. An organic electroluminescence device as claimed in claim 3, wherein the hole transport material represented by Formula 1 is one of the following compounds:
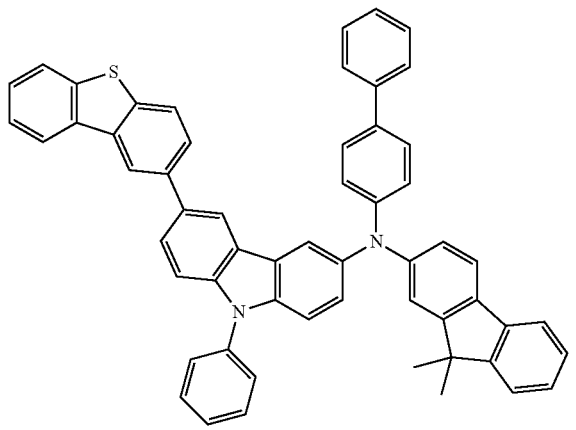
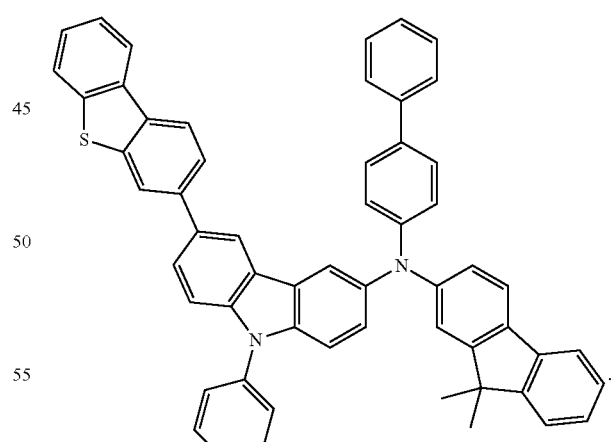
* * * * *